United States Patent
Kim et al.

(10) Patent No.: US 10,659,014 B2
(45) Date of Patent: May 19, 2020

(54) CLOCK CONTROL IN SEMICONDUCTOR SYSTEM

(71) Applicant: SAMSUNG ELECTRONICS CO., LTD., Suwon-si, Gyeonggi-Do (KR)

(72) Inventors: Yong Hwan Kim, Seoul (KR); Wook Kim, Yongin-si (KR); Ji Youn Kim, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 174 days.

(21) Appl. No.: 15/988,064

(22) Filed: May 24, 2018

(65) Prior Publication Data
US 2019/0115904 A1      Apr. 18, 2019

(30) Foreign Application Priority Data
Oct. 13, 2017   (KR) .................. 10-2017-0133562
Nov. 15, 2017   (KR) .................. 10-2017-0152061

(51) Int. Cl.
| | |
|---|---|
| H03K 3/03 | (2006.01) |
| H03K 3/011 | (2006.01) |
| G06F 1/08 | (2006.01) |
| H03K 19/00 | (2006.01) |
| H03K 19/003 | (2006.01) |
| G06F 1/324 | (2019.01) |

(52) U.S. Cl.
CPC ............ *H03K 3/0315* (2013.01); *G06F 1/08* (2013.01); *H03K 3/011* (2013.01); *H03K 19/0008* (2013.01); *H03K 19/00369* (2013.01); *G06F 1/324* (2013.01)

(58) Field of Classification Search
CPC ........ H03K 3/011; H03K 3/0315; G06F 1/08; H03L 7/0995
See application file for complete search history.

(56) References Cited

U.S. PATENT DOCUMENTS

| | | | |
|---|---|---|---|
| 7,286,020 B1 | 10/2007 | O et al. | |
| 7,982,550 B1 * | 7/2011 | Quevy ................ | H03L 1/022 331/176 |
| 8,154,335 B2 | 4/2012 | Chawla et al. | |
| 8,174,329 B2 | 5/2012 | Goodnow et al. | |
| 8,446,224 B2 | 5/2013 | Cortadella et al. | |

(Continued)

FOREIGN PATENT DOCUMENTS

JP          09281186          10/1997

*Primary Examiner* — Jeffrey M Shin
(74) *Attorney, Agent, or Firm* — F. Chau & Associates, LLC

(57) ABSTRACT

Clock generation and control in a semiconductor system having process, voltage and temperature (PVT) variation. A semiconductor device may include at least first and second ring oscillators, each disposed at locations respectively closest to first and second logic circuits of an operation circuit, and generating first and second oscillating signals. A detecting circuit is configured to perform a predetermined logic operation on the first oscillating signal and the second oscillating signal to generate a first clock signal. A calibration circuit is configured to receive the first clock signal from the detecting circuit and perform a delay control on each of the first ring oscillator and the second ring oscillator to generate a second clock signal for operating the operation circuit.

20 Claims, 12 Drawing Sheets

(56) References Cited

U.S. PATENT DOCUMENTS

| | | |
|---|---|---|
| 8,472,278 B2 | 6/2013 | Haass et al. |
| 8,558,626 B2 | 10/2013 | Rozen et al. |
| 8,639,987 B2 | 1/2014 | Whatmough et al. |
| 9,106,233 B1 * | 8/2015 | Rosen ................ H03L 7/00 |
| 9,455,708 B2 | 9/2016 | Hsiao et al. |
| 9,602,083 B2 | 3/2017 | Bollapalli et al. |
| 9,903,892 B2 * | 2/2018 | Zhang ............. G01R 19/252 |
| 2008/0288196 A1 * | 11/2008 | Singh ............ G01R 31/3016 |
| | | 702/79 |
| 2016/0334832 A1 * | 11/2016 | Epstein ................ G06F 1/08 |

\* cited by examiner

CLOCK CONTROL IN SEMICONDUCTOR SYSTEM

This application claims priority from Korean Patent Application No. 10-2017-0133562 filed on Oct. 13, 2017 and from Korean Patent Application No. 10-2017-0152061 filed on Nov. 15, 2017 in the Korean Intellectual Property Office, the disclosures of which are incorporated herein by reference in their entirety.

BACKGROUND

1. Technical Field

The present disclosure relates to clock generation and control in an integrated circuit, particularly in consideration of process, voltage and temperature (PVT) variations.

2. Discussion of Related Art

A semiconductor circuit such as an integrated circuit (IC) includes a plurality of logic circuits (or logic cells) containing transistors and other circuit elements. Performance and characteristics of the logic circuits may differ depending on PVT variation, where such variation may be global (occurring throughout the IC) and/or local variation (location-specific variation).

Global variation in a semiconductor circuit may occur due to varying production process parameters, supply voltage, and ambient temperature. For example, when voltage supplied to a semiconductor logic circuit is at a high end of a prescribed range, an operating frequency of the semiconductor circuit (e.g., reflected as processing speed) is also generally at a high end of a range. In a similar vein, when ambient temperature about an IC increases, operating frequency typically decreases. Changes in performance and characteristics of the semiconductor circuit are strongly influenced by PVT variation.

Local variation refers to variation depending on position in a semiconductor circuit, even though the semiconductor circuit is manufactured under uniform processing conditions. For example, localized temperature throughout the semiconductor circuit may vary due to the presence or absence of resistive elements generating heat (through an "instantaneous" voltage drop) in various locations. Voltage supply to logic circuits may also vary in magnitude depending on location within the chip. Thus, a first logic circuit located at a first point that differs in temperature from a second point, may have a different operating frequency and other characteristics differing from a second logic circuit of the same design located at the second point. Likewise, a logic circuit located at a point where supply voltage is near a low end of a prescribed range may operate slower than a logic circuit located at another point where supply voltage is higher.

A clock signal is an oscillating electronic signal necessary to operate logic circuits of a semiconductor circuit. The logic circuits may operate as intended when the frequency of the clock signal is within a certain range. However, if the clock signal frequency is too high when significant global/local PVT variation constrains a logic circuit's performance, the logic circuit may exhibit timing errors. Therefore, to generate a clock signal at a suitable clock frequency over a range of expected global and local variation, there is a method of providing a sufficient clock signal margin for a case in which maximum variations occur, i.e., the worst case.

However, setting a clock signal margin based on the worst case is a scheme in which a uniform criterion is applied to the entire semiconductor circuit, and does not typically result in optimized performance and power consumption of the semiconductor circuit. Moreover, the worst case setting scheme does not flexibly respond to a change in an operational environment.

SUMMARY

Aspects of the present inventive concept provide a semiconductor device and system with a clock generation and control technique capable of improving performance of an integrated circuit and reduce power consumption thereof by overcoming local variation and global variation corresponding to PVT while reducing a margin necessary for a clock signal for operating the integrated circuit.

Aspects of the present inventive concept also provide a semiconductor device and system capable of monitoring performance of an integrated circuit in consideration of local variation and global variation corresponding to PVT.

According to an aspect of the present inventive concept, a semiconductor device may include a first ring oscillator disposed at a first location and configured to generate a first oscillating signal. A second ring oscillator is disposed at a second location and configured to generate a second oscillating signal, where the first location is closer than the second location to a first logic circuit of an operation circuit, and the second location is closer than the first location to a second logic circuit of the operation circuit. A detecting circuit may be configured to generate a first clock signal by performing a predetermined logic operation on the first oscillating signal and the second oscillating signal. A calibration circuit may be configured to generate a second clock signal for operating the operation circuit by receiving the first clock signal from the detecting circuit and performing a delay control on each of the first ring oscillator and the second ring oscillator.

According to another aspect of the inventive concept, a semiconductor device may include the above first and second ring oscillators disposed with respect to the first and second logic circuits in the manner just noted. A detecting circuit may be configured to generate a first clock signal reflecting local variation of the operation circuit based on the first oscillating signal and the second oscillating signal. A calibration circuit is configured to receive the first clock signal from the detecting circuit and reflect global variation corresponding to production process parameters, supply voltage, and temperature (PVT) in the first clock signal to generate a second clock signal for operating the operation circuit.

According to yet another aspect of the inventive concept, a semiconductor device may include the above-mentioned first and second ring oscillators disposed with respect to the first and second logic circuits in the manner noted above. A phase-locked loop (PLL) is disposed at a third location in the operation circuit, and configured to generate a PLL clock signal. A detecting circuit is configured to perform a predetermined logic operation on the first oscillating signal, the second oscillating signal, and the PLL clock signal to generate a clock signal for operating the operation circuit.

According to a further aspect of the inventive concept, there is provided a semiconductor system including a first critical path replica configured to generate a first oscillating signal by reflecting a first condition associated with a first logic circuit in an operation circuit; a second critical path replica configured to generate a second oscillating signal by reflecting a second condition associated with a second logic circuit in the operation circuit; a monitor control circuit configured to generate a first critical path replica selection signal for selecting the first critical path replica, provide the generated first critical path replica selection signal to the first critical path replica, generate a second critical path replica selection signal for selecting the second critical path replica, and provide the generated second critical path replica selection signal to the second critical path replica; and a detecting circuit configured to receive the first critical path replica selection signal and the second critical path replica selection signal from the monitor control circuit and perform a predetermined logic operation on the first oscillating signal, the second oscillating signal, the first critical path replica selection signal, and the second critical path replica selection signal to generate a monitoring signal for monitoring the operation circuit.

In still another aspect of the inventive concept, a method for controlling a clock in an integrated circuit may involve generating a plurality N oscillating signals using N ring oscillators, respectively, where the N ring oscillators are respectively disposed closest to a different one of N logic circuits of the integrated circuit. A clock signal may be generated having a frequency that initially matches a slowest oscillation frequency among the N oscillating signals. A frequency of the clock signal may be adjusted responsive to signal timing testing using a critical path replica circuit. The clock signal having the adjusted frequency may be used to control the N logic circuits of the integrated circuit.

It should be noted that aspects of the present inventive concept are not limited to the aspects in this Summary section. Other aspects of the present inventive concept will be apparent to those skilled in the art from the following description.

BRIEF DESCRIPTION OF THE DRAWINGS

The above and other aspects and features of the present inventive concept will become more apparent by describing in detail example embodiments thereof with reference to the attached drawings, in which like reference elements denote like components or functions, wherein.

DETAILED DESCRIPTION OF EMBODIMENTS

Hereinafter, a semiconductor device according to some example embodiments of the present inventive concept will be described with reference to FIGS. 1 to 12.

Figure 1:
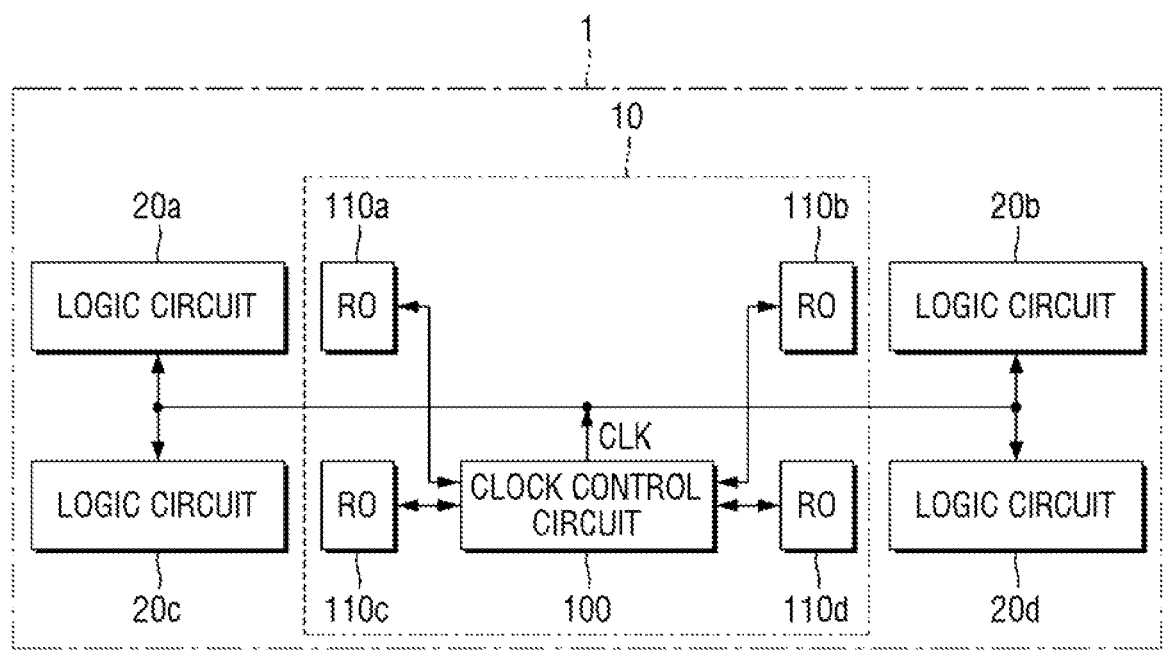
FIG. 1 is a schematic diagram illustrating a semiconductor system according to an embodiment of the present inventive concept.

FIG. 1 is a schematic diagram illustrating a semiconductor system, 1, according to an embodiment of the inventive concept. Semiconductor system 1 includes a plurality of logic circuits 20a, 20b, 20c, and 20d and a clock generation circuit 10. Hereafter, semiconductor system 1 may be interchangeably referred to as operation circuit 1 or integrated circuit (IC) 1.

The plurality of logic circuits 20a to 20d may include logic elements or logic cells for performing any function or task required by the operation circuit 1. For example, the plurality of logic circuits 20a to 20d may include logic devices each composed of a plurality of transistors and optionally other circuit elements (e.g. capacitors, resistors, etc.).

In this embodiment, the plurality of logic circuits 20a to 20d may be disposed at different positions in the operation circuit 1. Considering FIG. 1 as a plan view of operation circuit 1, clock generation circuit 10 is disposed in a central region and logic circuits 20a-20d are disposed outside the central region. For example, the logic circuits 20a and 20c are disposed in a region on a left side of operation circuit 1, and the logic circuits 20b and 20d may be disposed in a region on a right side of operation circuit 1. In another example layout, the logic circuits 20a and 20b may be disposed in a region positioned above the clock generation circuit 10 or the operation circuit 1, and the logic circuits 20c and 20d may be disposed in a region positioned under the clock generation circuit 10 or the operation circuit 1. In still other layouts, the clock generation circuit is not centrally located and/or more or fewer logic circuits 20 are positioned in proximity to clock generation circuit 10.

The clock generation circuit 10 generates a clock signal CLK for operating the operation circuit 1. In the embodiment, the clock generation circuit 10 includes a plurality of ring oscillators (ROs) 110a, 110b, 110c and 110d and a clock control circuit 100.

The plurality of ring oscillators 110a to 110d generate oscillating signals and provide the generated oscillating signals to the clock control circuit 100. For example, the plurality of ring oscillators 110a to 110d may include an odd number of inverting gates and may generate oscillating signals by means of the inverting gates. Feedback from the output to the input creates oscillation. A detailed structure of one example configuration for the ring oscillators 110a to 110d will be described below with reference to FIG. 3.

In accordance with the inventive concept, ring oscillators 110a to 110d may be disposed at different positions in the operation circuit 1, and each adjacent to a different logic circuit 20. That is, each of the ROs 110a-110d is disposed closest to a different one of the logic circuits 20a-20d. In this manner, the oscillation frequency of a signal output by each RO reflects the local environment (in terms of PVT) of the nearest (e.g. adjacent) logic circuit. For example, the ring oscillator 110a may be disposed at a point (i.e., location) adjacent to the logic circuit 20a, and the ring oscillator 110b may be disposed at a point adjacent to the logic circuit 201. Also, the ring oscillator 110c may be disposed at a point adjacent to the logic circuit 20c, and the ring oscillator 110d may be disposed at a point adjacent to the logic circuit 20d. If, for example, ROs 110a and 110b are of the same design, and have internal delays set the same way, ROs 110a and 110b would output oscillating signals with the same frequency when operating at the same ambient temperature and supply voltage (assuming minimal process variation between the ROs). However, if the local temperature around RO 110a is higher than that around RO 110b due to logic circuit 20a dissipating more power than logic circuit 20b, then the signal frequency output by RO 110a may be lower than that of RO 110b. A similar effect of differing RO output frequencies may occur if the ring oscillators (and logic circuits) receive different supply voltages from one another. Note that the effect of process variation may typically be more global than local and may not cause much difference in the signal frequency outputs among the ROs 110a-110d.

The clock control circuit 100 receives oscillating signals from the plurality of ring oscillators 110a to 110d disposed at different positions. Also, the clock control circuit 100 performs a predetermined logic operation (examples of which are described hereafter) on the oscillating signals to generate a clock signal CLK reflecting global variation and local variation of the operation circuit 1. The clock signal CLK generated by the clock control circuit 100 may operate the plurality of logic circuits 20a to 20d. Briefly explained, the clock signal CLK may be generated with a frequency that is determined to be suitable (e.g. to avoid timing errors in the logic circuits) and/or optimum for the highest processing speed, given the current PVT state of operation circuit 1. Operation of an example clock control circuit 100 is described in reference to FIG. 2.

Figure 2:
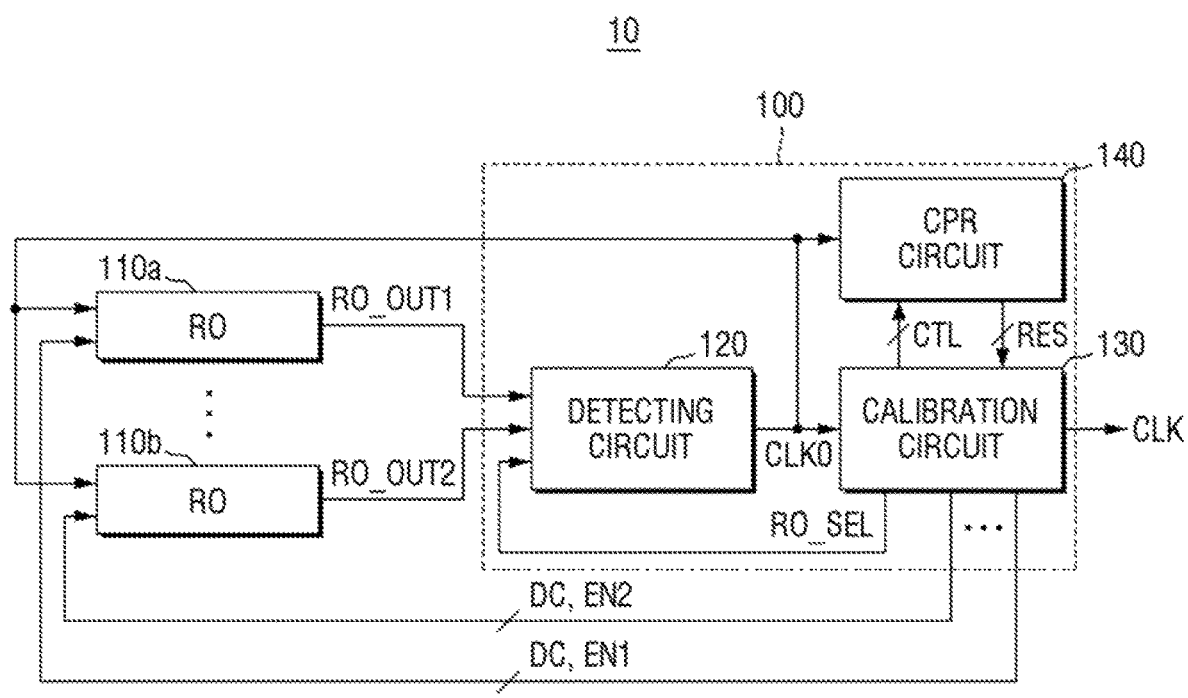
FIG. 2 is a schematic diagram illustrating a semiconductor device according to an embodiment of the present inventive concept.

FIG. 2 is a schematic diagram illustrating an example clock generation circuit 10 according to an embodiment of the present inventive concept. (Clock generation circuit 10 is also an example of a semiconductor device according to the inventive concept.) Clock generation circuit 10 includes at least ring oscillators 110a and 110b and the clock control circuit 100 described above. For clarity of explanation, operations using at least two ring oscillators 110a and 110b are explained hereafter (where additional ROs such as ROs 110c and 110d are optionally included between ROs 110a and 110b in FIG. 2). In general, clock generation circuit 10 includes at least two ROs, but the number of ROs may be set by a designer and may depend on how many logic circuit regions within operation circuit 1 the designer wishes to monitor and reflect using the ROs. The description below is equally applicable to the use of just a single RO, or at least three ROs within clock generation circuit 10.

As described with reference to FIG. 1, ring oscillators 110a to 110d are disposed at different points in the operation circuit 1. Referring collectively to FIGS. 1 and 2, the first ring oscillator 110a is disposed at a first point, which is adjacent to the first logic circuit 20a in the operation circuit 1, and configured to generate a first oscillating signal RO_OUT1. Second ring oscillator 110b is disposed at a second point, which is adjacent to the second logic circuit 20b in the operation circuit 1 and different from the first point, and configured to generate a second oscillating signal RO_OUT2.

The clock control circuit 100 may include a detecting circuit 120, a calibration circuit 130, and a critical path replica (CPR) circuit 140.

The detecting circuit 120 generates a first clock signal CLK0 reflecting local variation based on the first oscillating signal RO_OUT1 output from the first ring oscillator 110a and the second oscillating signal RO_OUT2 output from the second ring oscillator 110b. (If ROs 110c and 110d are included within clock generation circuit 100 of FIG. 2, they may output third and fourth oscillating signals RO_OUT3 and RO_OUT4 to detecting circuit 120, which in turn generates the first clock signal CLK0 based on these signals also.) For instance, detecting circuit 120 may provide the first clock signal CLK0 at a clock frequency matching the lowest oscillation frequency among first and second oscillating signals RO_OUT1 and RO_OUT2. Suppose, for example, temperature is locally high near RO 110a such that the logic circuit 20a adjacent RO 110a may best operate at a relatively low clock frequency to ensure minimal timing errors. In this case, the oscillation frequency of RO 110a is relatively low, reflecting the local environment of logic circuit 20a (since RO 110a inherently outputs an oscillation signal with frequency positively correlated with operating temperature of RO 110a). Clock control circuit 100 (through detecting circuit 120, calibration circuit 130 and CPR circuit 140, explained hereafter) may thereafter provide the output clock signal CLK at a relatively low frequency to ensure error-free operation of logic circuit 20a. On the other hand, if none of the ROs reflects a locally high temperature, clock control circuit 100 may output the clock signal CLK at a relatively high clock frequency and thereby optimize performance of operation circuit 1 (e.g. processing speed is faster with the higher clock speed).

Here, local variation refers to, for example, a variation depending on position in a semiconductor circuit, even though the semiconductor circuit is manufactured under uniform process conditions. (With uniform process conditions, process variation between different logic circuits of operation circuit 1 may be minimal and may not be a cause of excessive performance variation between logic circuits). For example, when temperature at a first point in the semiconductor circuit differs significantly from a temperature at a second point in the semiconductor circuit, a logic circuit located at the first point and a logic circuit located at the second point may have differing performance and characteristics. As another example, a logic circuit located at a point where a voltage drop instantaneously occurs in the semiconductor circuit may have different performance and characteristics from a logic circuit located at another point.

Detecting circuit 120 may generate the first clock signal CLK0 by performing a predetermined logic operation on the first oscillating signal RO_OUT1 and the second oscillating signal RO_OUT2. For example, in a first operation mode, the detecting circuit 120 may track the slowest oscillations from among the first oscillating signal RO_OUT1 and the second oscillating signal RO_OUT2 (or track the slowest transition in the first and second oscillating signals RO_OUT1 and RO_OUT2). For example, in a second operation mode, the detecting circuit 120 may output a clock signal at a frequency matching only the slowest one of the first oscillating signal RO_OUT1 and the second oscillating signal RO_OUT2 (or may output a transition of only one of the first oscillating signal RO_OUT1 and the second oscillating signal RO_OUT2).

The calibration circuit 130 receives the first clock signal CLK0 from the detecting circuit 120 and a result signal RES from CPR circuit 140. Based on the RES signal, calibration circuit 130 reflects global variation corresponding to production process parameters, supply voltage, and temperature (PVT) in the first clock signal CLK0 to generate a second clock signal CLK for operating the operation circuit 1. For example, as explained later with respect to FIG. 7, based on the RES signal, the frequency of the second clock signal CLK may be reduced below an initial frequency of the first clock signal CLK0. Such clock frequency reduction may be warranted if global simulation testing within the CPR circuit 140 indicates that timing errors in critical paths could otherwise occur if the clock speed was not reduced below that of the first clock signal CLK0's initial frequency.

Here, global variation refers to variation occurring in a semiconductor circuit according to the production process parameters, the supply voltage, and the temperature. For example, when a voltage supplied to a semiconductor circuit increases, an operating frequency of the semiconductor circuit also generally increases. Changes in performance and characteristics of the semiconductor circuit are strongly influenced by the PVT.

In further detail, by performing a delay control on the first ring oscillator 110a and the second ring oscillator 110b, the calibration circuit 130 may generate a second clock signal CLK for operating the operation circuit 1. Here, the delay control refers to a task of matching a delay of the first clock signal CLK0 reflecting local variation to an environment of the operation circuit 1. To this end, the calibration circuit 130 may provide a delay control signal DC to the first ring oscillator 110a and the second ring oscillator 110b. The delay control signal DC controls internal delay of the first ring oscillator 110a and thereby controls the frequency of the oscillating output signal, with higher delays resulting in a slower oscillating frequency.

Also, the calibration circuit 130 may provide, to the first ring oscillator 110a and the second ring oscillator 110b, an enable signal EN for enabling only one of the first ring oscillator 110a and the second ring oscillator 110b. (FIG. 2 shows different enable signals EN1, EN2 applied to RO 110a, RO 110b, respectively.)

Further, the calibration circuit 130 may provide a ring oscillator selection signal RO_SEL to the detecting circuit 120 and may receive an output of a ring oscillator enabled by the enable signal EN from the detecting circuit 120 operating in the second operation mode.

The critical path replica circuit 140 receives the first clock signal CLK0 from the detecting circuit 120 and checks whether the first clock signal CLK0 generates timing errors in a plurality of predetermined critical paths.

The critical path replica circuit 140 determines whether the first clock signal CLK0 has a timing error by means of a plurality of predetermined critical path replicas (CPRs), and each of the critical path replicas (CPRs) corresponds to a replica circuit that utilizes a critical path, which corresponds to a PVT condition of the operation circuit 1 in its current state. For instance, a CPR may be a replica of a particular logic circuit within operation circuit 1, so that a performance simulation of that logic circuit may be performed via testing the CPR. It may be assumed that the CPR and the actual logic circuit within operation circuit 1 have minimal process variations therebetween, since they were fabricated together (even though process effects vary from chip to chip and lot to lot, etc.). The CPR experiences substantially the same ambient global temperature and operates at substantially the same voltage as the actual logic circuit (both of which may vary with time and circumstance). Therefore, the performance simulation with the CPR may reflect the global PVT condition of the logic circuit.

According to a control signal (CTL) received from the calibration circuit 130, the critical path replica circuit 140 applies a test pulse to a plurality of critical path replicas to determine whether the first clock signal CLK0 has a timing error (or would cause timing errors within a CPR due to clock speed being too high) and then delivers a determination result signal TES_OUT to the calibration circuit 130.

Figure 3:
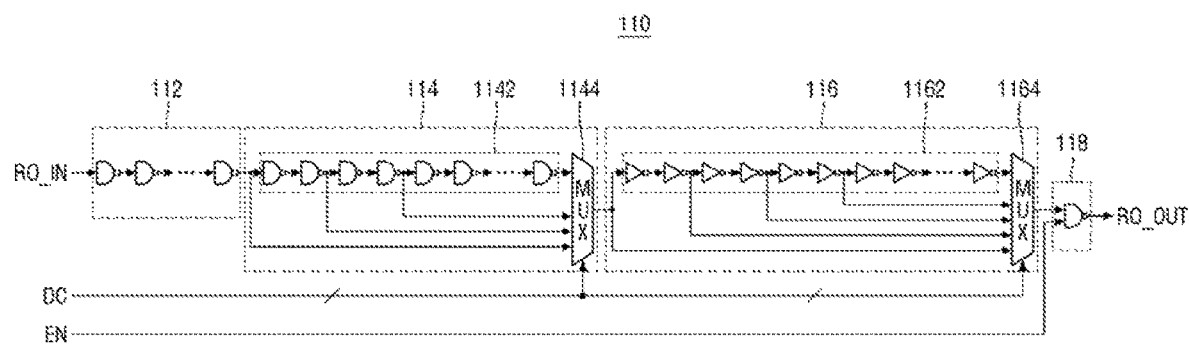
FIG. 3 is a schematic diagram illustrating an example ring oscillator according to an embodiment of the present inventive concept.

FIG. 3 is a schematic diagram illustrating an example of a ring oscillator, 110, which may be used for any of the ring oscillators described herein. Ring oscillator 110 may include a default oscillation period adjusting circuit 112, a first oscillation period adjusting circuit 114, and a second oscillation period adjusting circuit 116. With ring oscillator 110, delays between series-connected elements are adjustable responsive to the externally applied delay control (DC) signal. A DC signal indicating a relatively longer delay is for generating a relatively lower frequency of oscillation of the RO output signal RO_OUT. Note that ring oscillator 110 differs from many conventional ring oscillators that use a direct feedback from the output port back to the input for producing oscillations.

The default oscillation period adjusting circuit 112 may include a plurality of inverting gates 123. The default oscillation period adjusting circuit 112 generates an oscillating signal from an input signal RO_IN by means of the plurality of inverting gates 123 and then delivers the generated oscillating signal to the first oscillation period adjusting circuit 114.

In this embodiment, the input signal RO_IN of the ring oscillator 110 may be a feedback signal of the first clock signal CLK0 generated by the detecting circuit 120. Returning momentarily to FIGS. 2 and 3, in the first operation mode, the detecting circuit 120 may enable the first clock signal CLK0 to reflect local variation by tracking the slowest oscillation frequency among the first oscillating signal RO_OUT1 and the second oscillating signal RO_OUT2 and then feeding the generated first clock signal CLK0 (having a clock frequency substantially equaling the slowest oscillation frequency that was tracked) back to the ring oscillators 110a and 110b.

The first oscillation period adjusting circuit 114 may include a plurality of inverting gates 1142 and a multiplexer (MUX) 1144. The first oscillation period adjusting circuit 114 may adjust an oscillation period of the oscillating signal received from the default oscillation period adjusting circuit 112 to a first unit period. That is, the first oscillation period adjusting circuit 114 may adjust a delay of the oscillating signal received from the default oscillation period adjusting circuit 112 to the first unit period.

To this end, the first oscillation period adjusting circuit 114 may receive the delay control signal DC from the calibration circuit 130. The delay control signal DC may control the first oscillation period adjusting circuit 114 through a multiplexer 1144 to adjust an oscillation period to the first unit period.

Subsequently, the first oscillation period adjusting circuit 114 delivers, to the second oscillation period adjusting circuit 116, an oscillating signal having the oscillation period adjusted to the first unit period.

The second oscillation period adjusting circuit 116 may include a plurality of inverting gates 1162 and a multiplexer (MUX) 1164.

The second oscillation period adjusting circuit 116 may adjust an oscillation period of the oscillating signal received from the first oscillation period adjusting circuit 114 to a second unit period smaller than the first unit period. That is, the second oscillation period adjusting circuit 116 may adjust a delay of the oscillating signal received from the first oscillation period adjusting circuit 114 to the second unit period.

To this end, the second oscillation period adjusting circuit 116 may receive the delay control signal DC from the calibration circuit 130. The delay control signal DC may control the second oscillation period adjusting circuit 116 through the multiplexer 1164 to adjust an oscillation period to the second unit period.

Subsequently, the second oscillation period adjusting circuit 116 delivers, to an enable setting circuit 118, an oscillating signal having the oscillation period adjusted to the second unit period.

According to the enable signal EN received from the calibration circuit 130, the enable setting circuit 118 may enable or disable an output of an oscillating signal having passed through the default oscillation period adjusting circuit 112, the first oscillation period adjusting circuit 114, and the second oscillation period adjusting circuit 116.

Subsequently, an output signal RO_OUT output by the enable setting circuit 118 may be delivered to the detecting circuit 120.

As described above, the ring oscillator 110 may be implemented as an adjustable ring oscillator capable of adjusting an oscillation period, thereby adjusting the frequency of the output oscillation signal RO_OUT.

As discussed earlier, according to the present inventive concept, the plurality of ring oscillators 110a to 110d (see FIG. 1) may be disposed at several points of the operation circuit 1 to generate a clock signal reflecting local variation of the operation circuit 1. The periods of the clock signal for operating the logic circuits 20a to 20d may be different for each of the points. To take this into consideration, the plurality of ring oscillators 110a to 110d may be implemented as adjustable ring oscillators to perform delay control appropriate for each point. However, in the example of FIG. 1, the same clock signal CLK is applied to each logic circuit 20a-20d and thus all of the logic circuits 20a-20d may operate at the same clock speed. As explained later in connection with FIG. 7, clock speed may need to be reduced further as a result of simulation testing. In this case, a selected one of the ring oscillators may be delay adjusted by means of the delay control signal DC to produce a slower RO oscillating output signal, which may then be propagated through detecting circuit 120 and calibration circuit 130 to generate the final, slower output clock signal CLK. In other embodiments, multiple clock signals at different clock speeds may be generated and each applied to a different one of the logic circuits 20a-20d. Each of these clock signals may originate from a different one of the ring oscillators 110a-110d controlled by a respective delay control signal DC to oscillate at a unique frequency.

In some embodiments of the present inventive concept, the plurality of inverting gates 1142 of the first oscillation period adjusting circuit 114 of the ring oscillator 110 may be implemented using the same type of logic gates as those of the plurality of inverting gates 1162 of the second oscillation period adjusting circuit 116.

For example, the plurality of inverting gates 1142 of the first oscillation period adjusting circuit 114 of the ring oscillator 110 may be implemented using a first type logic gate, for example, a NAND logic gate 123 (where each input line shown is split into two lines to provide first and second inputs of the same logic level, the NAND gate 123 thereby forming a NOT gate), and the plurality of inverting gates 1162 of the second oscillation period adjusting circuit 116 of the ring oscillator 110 may be implemented using a second type logic gate, for example, an inverter.

Other suitable configurations for ring oscillator 110 are contemplated. Any configuration capable of providing the output oscillating signal RO_OUT based on the feedback signal and having an adjustable oscillating frequency responsive to an input delay control signal DC, and enabled by the signal EN, may suffice.

In some embodiments of the present inventive concept, the plurality of ring oscillators 110a to 110d may be implemented using the same type of logic cells or different types of logic cells.

Figure 4:
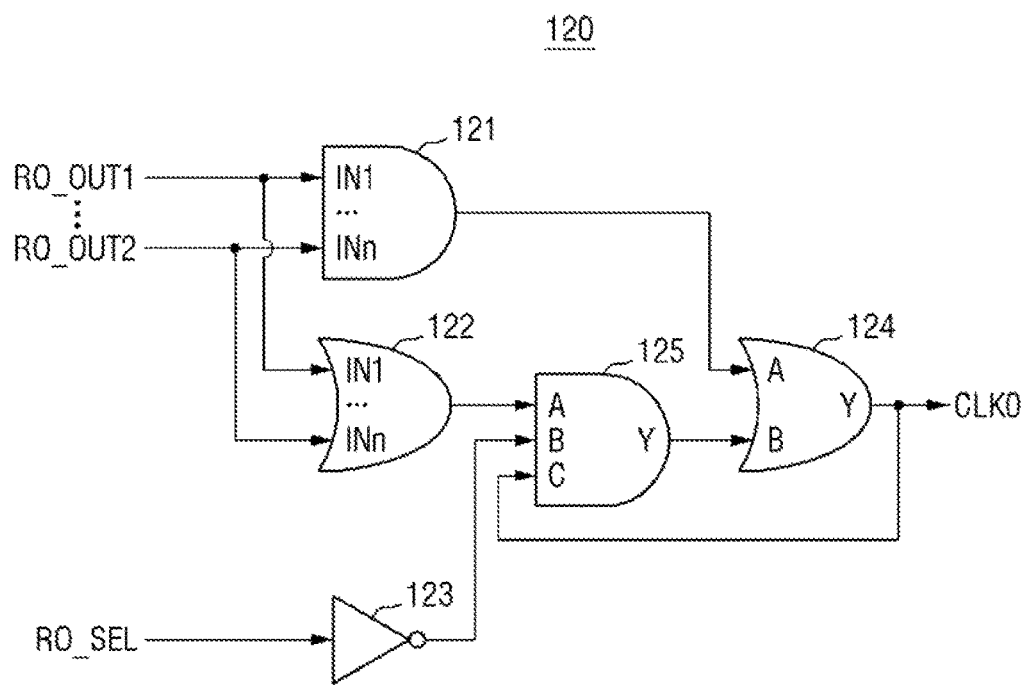
FIG. 4 is a schematic diagram illustrating a detecting circuit according to an embodiment of the present inventive concept.

FIG. 4 is a schematic diagram illustrating one example of a detecting circuit 120 according to an embodiment of the present inventive concept. The detecting circuit 120 may include a first logic gate 121, a second logic gate 122, a third logic gate 124, and a fourth logic gate 125. In the shown configuration, detection circuit 120 has a "C-element" design, used for handling asynchronous inputs, that maintains a previous output state when two asynchronous inputs meet a certain criterion. The shown C-element configuration of detection circuit 120 is sufficient to output the first clock frequency signal CLK0 at a frequency matching the slowest oscillation frequency of the plurality of asynchronous input signals.

The first logic gate 121 may be a multi-input AND logic gate for performing a first logic operation, for example, an AND logic operation, on a plurality of input signals. The first logic gate 121 performs the first logic operation on the first oscillating signal RO_OUT1 and the second oscillating signal RO_OUT2 and delivers the result signal to the third logic gate 124.

The second logic gate 122 may be a multi-input OR logic gate for performing a second logic operation, for example, an OR logic operation, on a plurality of input signals. The second logic gate 122 performs the second logic operation on the first oscillating signal RO_OUT1 and the second oscillating signal RO_OUT2 and delivers the result signal to the fourth logic gate 125.

The third logic gate 124 may be an OR logic gate for performing a third logic operation, for example, an OR logic operation, on two input signals. The third logic gate 124 performs the third logic operation on an output signal of the first logic gate 121 and an output signal of the fourth logic gate 125 and delivers the result signal as the first clock signal CLK0.

The fourth logic gate 125 may be a multi-input AND logic gate for performing a fourth logic operation, for example, an AND logic operation, on a plurality of input signals. The fourth logic gate 125 performs the fourth logic operation on an output signal of the second logic gate 122, an inverted signal of a ring oscillator selection signal RO_SEL, and an output signal of the third logic gate 124 and delivers the result signal to the third logic gate 124.

Here, the ring oscillator selection signal RO_SEL refers to a signal the calibration circuit 130 provides to the detecting circuit 120 to receive an output of a ring oscillator enabled by the enable signal EN from the detecting circuit 120.

Referring collectively to FIGS. 2 and 4, when the selection signal RO_SEL is a first value, for example, "0," the detecting circuit 120 may track the slowest oscillation frequency among the first oscillating signal RO_OUT1 and the second oscillating signal RO_OUT2 in the first operation mode and may output the result signal as the first clock signal CLK0 (at a clock frequency matching the slowest oscillation frequency).

Thus, the first clock signal CLK0 may reflect local variation of the operation circuit 1. More specifically, the first clock signal CLK0 may reflect a first operational environment of the first logic circuit 20a by using the first oscillating signal RO_OUT1 and may reflect an operational environment of the second logic circuit 20b by using the second oscillating signal RO_OUT2.

When the selection signal RO_SEL is a second value, for example "1," the detecting circuit 120 may propagate only an oscillating signal output from the ring oscillator enabled by the enable signal EN (i.e., one of the first oscillating signal RO_OUT1 and the second oscillating signal RO_OUT2), in the second operation mode. In other words, in the second operating mode the first clock signal CLKO may have a clock frequency matching the frequency of the oscillating signal RO_OUT1 or RO_OUT2 selected by the enable signal.

Specifically, the calibration circuit 130 may enable the first ring oscillator 110a and disable the second ring oscillator 110b, and vice versa, by using the enable signal EN. In addition, the calibration circuit 130 may perform a delay control on the enabled first ring oscillator 110a by using a delay control signal DC.

The detecting circuit 120 operating in the second operation mode may output, as the first clock signal CLK0, a propagating signal of the first ring oscillator 110a, which is enabled and on which the delay control is performed.

Subsequently, the calibration circuit 130 may enable the second ring oscillator 110b and disable the first ring oscillator 110a by using the enable signal EN. In addition, the calibration circuit 130 may perform a delay control on the enabled second ring oscillator 110b by using a delay control signal DC.

The detecting circuit 120 operating in the second operation mode may output, as the first clock signal CLK0, a propagating signal of the second ring oscillator 110b, which is enabled and on which the delay control is performed.

Thus, the first clock signal CLK0 may reflect global variation corresponding to PVT of the operation circuit 1.

In some embodiments of the present inventive concept, through the delay control, the calibration circuit 130 may match a delay of the first clock signal CLK0 reflecting local variation to an environment of the operation circuit 1 and then additionally set a margin for the first clock signal CLK0.

Figure 5:
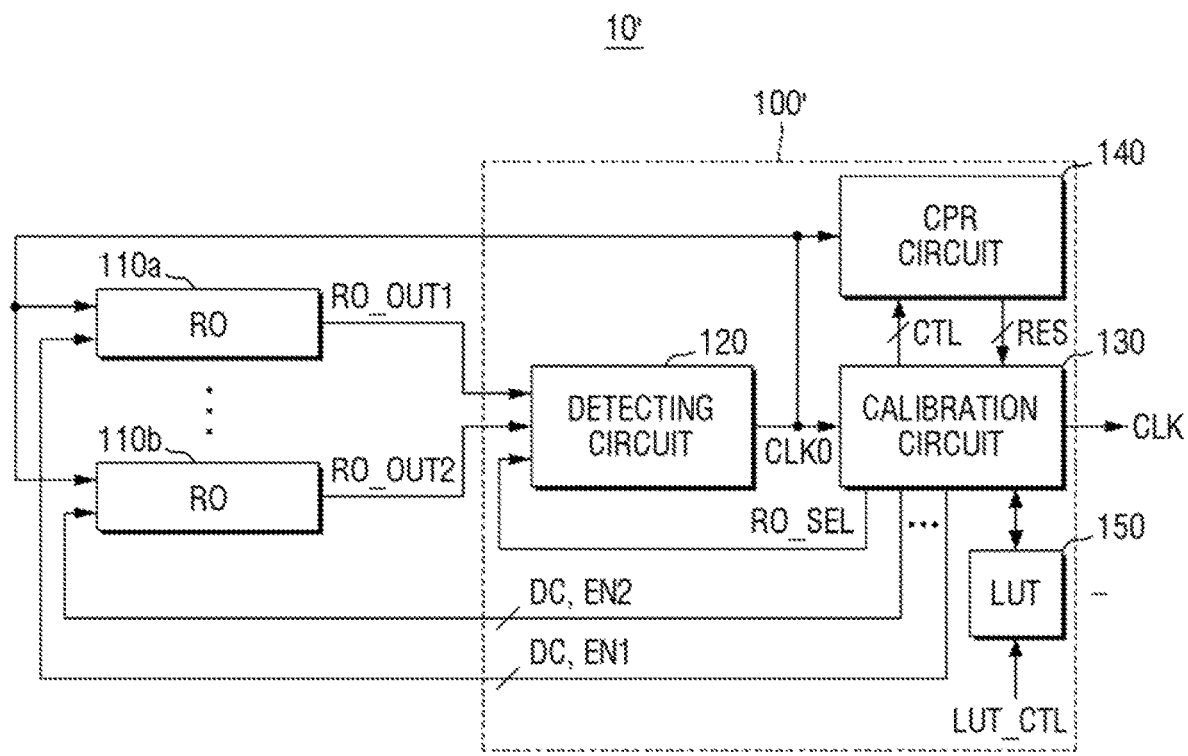
FIG. 5 is a schematic diagram illustrating a semiconductor device according to an embodiment of the present inventive concept.

FIG. 5 is a schematic diagram for illustrating a clock generation circuit according to an embodiment of the present inventive concept. In this example, a clock generation circuit 10' (which is a semiconductor device according to an embodiment of the present inventive concept) may differ from clock generation circuit 10 by further including a look up table (LUT) 150.

The look up table 150 may be accessed by the calibration circuit 130 to obtain data. In detail, the look up table 150 may prestore data regarding delay settings corresponding to one or more PVT conditions.

The calibration circuit 130 may receive the prestored data from the look up table 150 and may perform a delay control on the first ring oscillator 110a and the second ring oscillator 110b based on the received data.

In this embodiment, the look up table 150 may be implemented in a volatile memory, which includes a dynamic random access memory (DRAM), or may be implemented in a non-volatile memory, which includes a flash memory.

Figure 6:
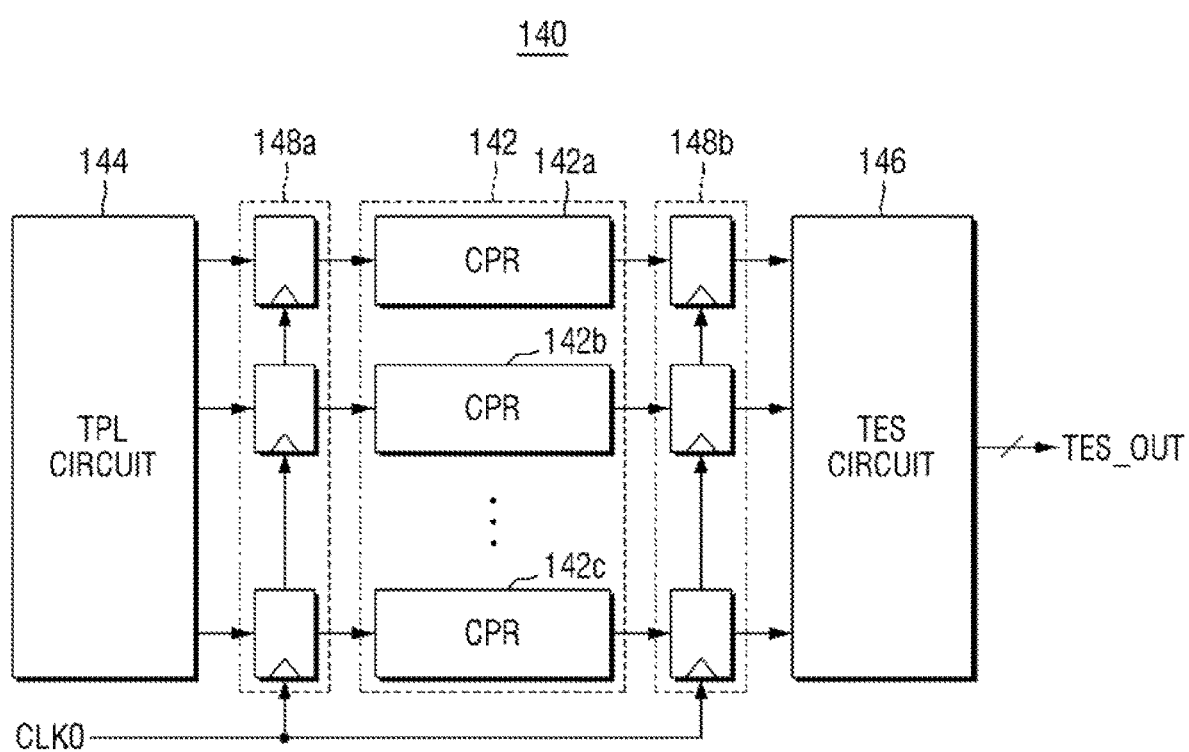
FIG. 6 is a schematic diagram illustrating a critical path replica circuit according to an embodiment of the present inventive concept.

FIG. 6 is a schematic diagram illustrating an example critical path replica circuit 140 according to an embodiment of the present inventive concept. Critical path replica (CPR) circuit 140 may include a test pulse launching (TPL) circuit 144, a critical path replica circuit unit 142, and a timing error statistics (TES) circuit 146. CPR circuit 140 may further include a first latch unit 148a and a second latch unit 148b that control progress of a test pulse according to the first clock signal CLK0 received through the detecting circuit 120.

The TPL circuit 144 generates a test pulse for checking whether the first clock signal CLK0 has a timing error. For instance, the first clock signal CLK0 may be considered to have a timing error if one of a plurality of different critical path replicas within CPR circuit 140 fails a timing error test based on the current clock frequency of the first clock signal CLK0.

Specifically, the TPL circuit 144 generates a test pulse according to a control signal CTL received from the calibration circuit 130 and delivers the generated test pulse to the first latch unit 148a. The test pulse is applied to the critical path replica circuit unit 142 through the first latch unit 148a synchronized according to the first clock signal CLK0.

The critical path replica circuit unit 142 includes a plurality of critical path replicas 142a to 142c. Here, each of the critical path replicas 142a to 142c corresponds to a replica circuit that utilizes a critical path, which corresponds to a PVT condition of the operation circuit 1 in its current state.

In detail, the first critical path replica 142a may reflect a first predetermined condition, that is, a first PVT condition. For example, the first critical path replica 142a may be a replica circuit "borrowing" a critical path extracted from a first corner. Here, a corner may refer to either a process corner or a certain region of the IC 1. In the latter case, a critical path may be "borrowed" by providing a circuit substantially replicating a critical path circuit that exists in that region.

The second critical path replica 142b may reflect a second predetermined condition, that is, a second PVT condition. For example, the second critical path replica 142b may be a replica circuit borrowing a critical path extracted from a second corner and a third corner.

In some embodiments of the present inventive concept, the number of critical path replicas 142a to 142c may be optimized to be smaller than the number of critical paths extracted from all corners. For example, the plurality of critical path replicas 142a to 142c may include, among the critical paths extracted from the corners, only a result obtained from additionally filtering paths capable of satisfying a timing signoff condition.

The critical path replica circuit unit 142 applies a test pulse to the plurality of critical path replicas 142a to 142c and then delivers the result signal to the timing error detecting circuit 146 through the second latch unit 148b synchronized according to the first clock signal CLK0.

Based on the result signal received through the second latch unit 148b, the timing error detecting circuit 146 determines whether the first clock signal CLK0 generates a timing error in several critical paths in the operation circuit 1, and then delivers a determination result signal TES_OUT to the calibration circuit 130.

For example, to determine a timing error of the TPL circuit 144, the critical path replica circuit 140 generates a test pulse transitioning, for example, from "0" to "1," checks whether a value captured by the timing error detecting circuit 146 is "0," and determines that a timing error has occurred when the value is not "0,". An alternative timing error test may use a falling edge of a pulse.

Figure 7:
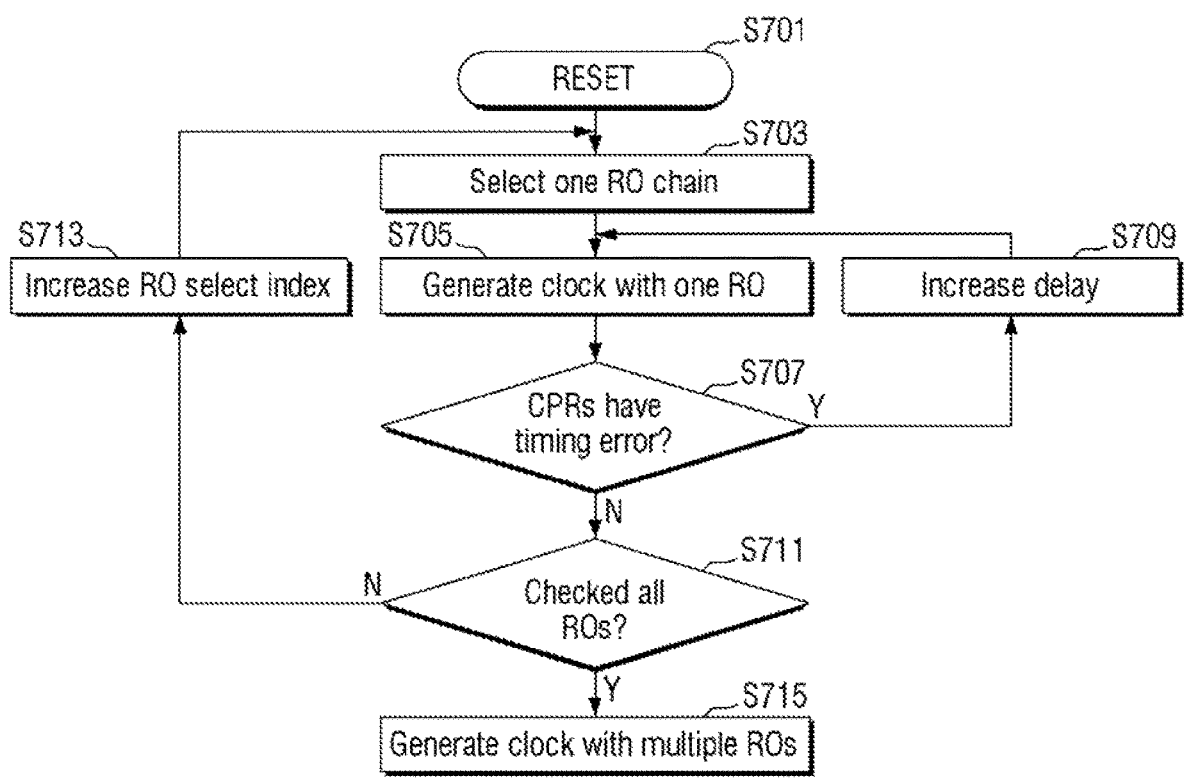
FIG. 7 is a flowchart illustrating a method of generating and controlling a clock in a semiconductor device according to an embodiment of the present inventive concept.

FIG. 7 is a flowchart illustrating a method of generating and controlling a clock in a semiconductor device according to an embodiment of the present inventive concept. The method may be performed by clock generation circuit 10 which, as part of a reset operation (S701), may output a first clock signal CLK0 initially having a frequency that matches the slowest oscillation frequency among the first oscillating signal RO_OUT1 and the second oscillating signal RO_OUT2. Alternatively, the first clock signal CLKO tracks the slowest transition in the oscillating signals RO_OUT1 and RO_OUT2.

Subsequently, calibration circuit 130 may select one of the plurality of ring oscillators 110a to 110d by using an enable signal EN (S703). The detecting circuit 120 may then generate the first clock signal CLK0 by means of the selected ring oscillator (S705).

Next, the calibration circuit 130 determines whether a timing error of the first clock signal CLK0 has occurred by using critical path replicas 142a to 142c of critical path replica circuit 140 (S707).

In addition, when it is determined that a timing error of the first clock signal CLK0 has occurred (Y in S707), the calibration circuit 130 controls a delay of the selected ring oscillator by using a delay control signal DC (S709) and then performs step S705 again. In the illustrated example, delay is increased in operation S709 to thereby decrease the frequency the oscillating signal output by the selected RO chain and decrease the clock frequency of the first clock signal CLK0. However, the delay control may either decrease or increase a frequency of oscillation of an oscillating signal output by the selected RO chain to thereby correspondingly change the clock frequency of the first clock signal CLK0.

When it is determined that a timing error of the first clock signal has not occurred (N in S707), the calibration circuit 130 determines whether all delay control tasks for the other ring oscillators have been completed (S711).

When all tasks have been completed (Y in S711), the calibration circuit 130 generates a second (output) clock signal CLK by means of the plurality of ring oscillators 110a to 110d.

When at least one task remains (N in S711), the calibration circuit 130 increases an index to select another ring oscillator and performs step S703. Then, the calibration circuit 130 selects another of the plurality of ring oscillators 110a to 110d by using an enable signal EN and proceeds with the ensuing steps.

Figure 8:
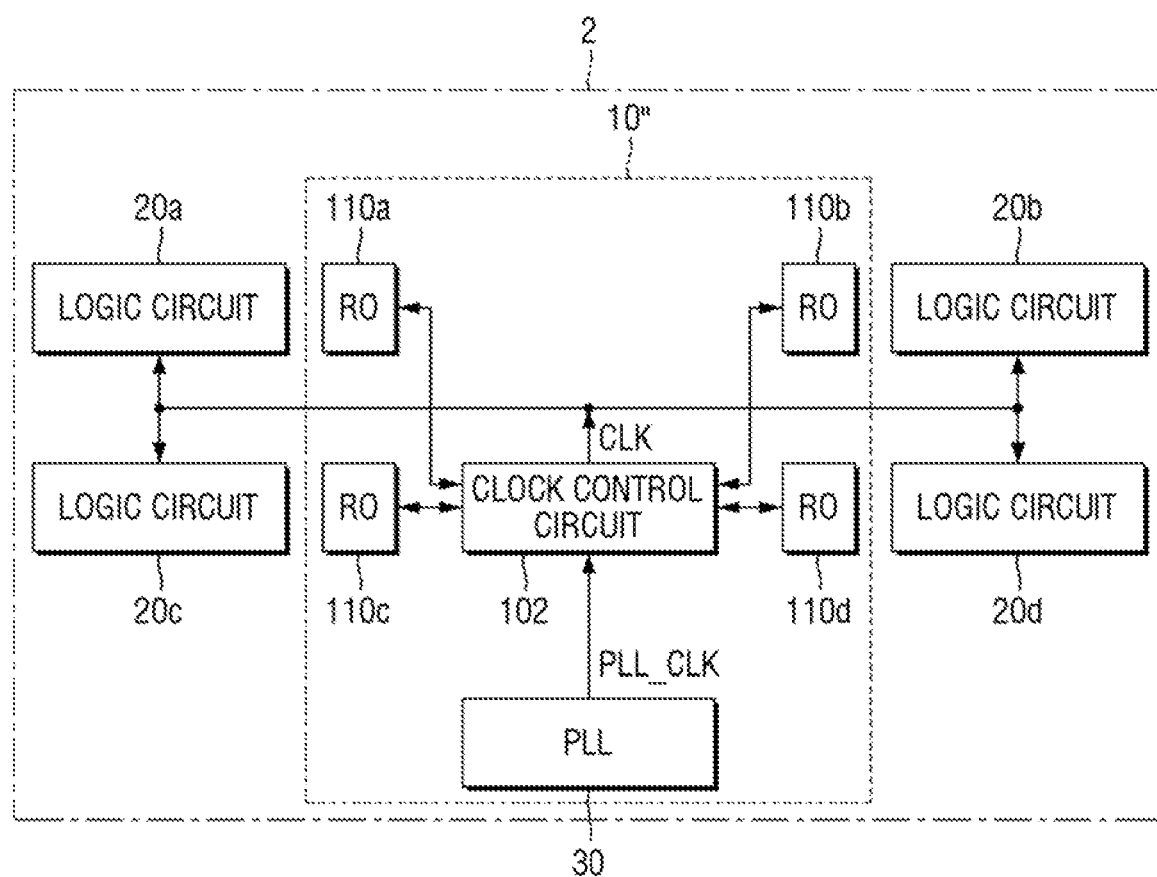
FIG. 8 is a schematic diagram illustrating a semiconductor system according to an embodiment of the present inventive concept.

FIG. 8 is a schematic diagram illustrating a semiconductor system (operation circuit) 2, according to an embodiment of the present inventive concept. Operation circuit 2 includes a plurality of logic circuits 20a to 20d, and a clock generation circuit 10" which differs from clock generation circuit 10 of FIG. 1 by including a phase-locked loop (PLL) 30. Logic circuits 20a-20d and other aspects clock generation circuit 10" may be the same or similar to those described with reference to FIG. 1. Thus, logic circuits 20a to 20d may be disposed at different positions in the operation circuit 2, and the plurality of ring oscillators 110a to 110d may also be disposed at different corresponding positions in the operation circuit 2.

The PLL 30 may provide a PLL clock signal PLL_CLK to a clock control circuit 102 of the clock generation circuit 10". Clock control circuit 102 may also receive oscillating signals from the plurality of ring oscillators 110a to 110d.

According to an operational environment of the operation circuit 2, the clock control circuit 102 may appropriately perform switching on the oscillating signals received from the plurality of ring oscillators 110a to 110d and on the PLL clock signal PLL_CLK received from the PLL 30 to generate a clock signal CLK for operating the operation circuit 2.

Below, an operation of the clock control circuit 102 will be described in detail with reference to FIGS. 9A and 9B.

Figure 9A:
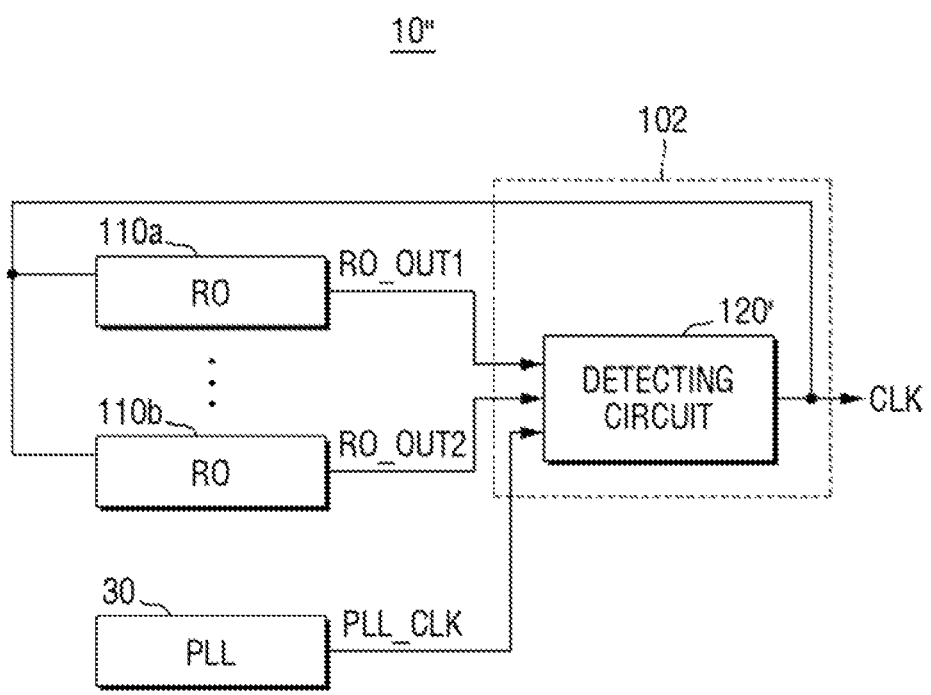
FIG. 9A is a schematic diagram illustrating a semiconductor device according to an embodiment of the present inventive concept.

FIG. 9A is a schematic diagram illustrating an example clock generation circuit 10" according to an embodiment of the present inventive concept. Clock generation circuit 10" (which is another example of a semiconductor device according to the inventive concept) includes at least two ring oscillators 110a and 110b, the PLL 30, and the clock control circuit 102. For clarity of explanation, two ring oscillators 110a and 110b will be discussed in this embodiment, but in other variations of this embodiment, more or fewer than two ring oscillators may be utilized. Clock control circuit 102 differs from clock control circuit 100 described above via a modified detecting circuit 120' and by omitting a CPR circuit and a calibration circuit. An example configuration of detecting circuit 120' is shown in FIG. 9B.

As described with reference to FIG. 8, the plurality of ring oscillators 110a to 110d are disposed at different points in the operation circuit 2. Referring collectively to FIGS. 8, 9A and 9B, the first ring oscillator 110a is disposed at a first point, which is adjacent to the first logic circuit 20a in the operation circuit 2, and configured to generate a first oscillating signal RO_OUT1. Also, the second ring oscillator 110b is disposed at a second point, which is adjacent to the second logic circuit 20b in the operation circuit 2 and different from the first point, and configured to generate a second oscillating signal RO_OUT2. Thus, the first oscillating signal RO_OUT1 reflects a first operational environment of the first logic circuit 20a, and the second oscillating signal RO_OUT2 reflects an operational environment of the second logic circuit 20b.

The PLL 30 generates a PLL clock signal PLL_CLK, which is an oscillating signal of a predetermined frequency, independent of the location at which the PLL 30 is disposed in the operation circuit 2.

Detecting circuit 120' may generate a clock signal CLK reflecting local variation based on the first oscillating signal RO_OUT1 output from the first ring oscillator 110a and the second oscillating signal RO_OUT2 output from the second ring oscillator 110b, and may generate a clock signal CLK unrelated to local variation on the basis of the PLL clock signal PLL_CLK.

For example, when a voltage drop occurs in the first logic circuit 20a while the operation circuit 2 is operated by a clock signal based on the PLL clock signal PLL_CLK, the detecting circuit 120 may generate a clock signal CLK based on the first oscillating signal RO_OUT1 output from the first ring oscillator 110a to take local variation into consideration. That is, the voltage drop causes localized heat dissipation nearest to the first ring oscillator 110a but not as much at the second ring oscillator 110b. The higher temperature at first ring oscillator 110a causes the first oscillating signal RO_OUT1 to oscillate at a lower frequency than the second oscillating signal RO_OUT2 and the PLL clock signal PLL_CLK.

To this end, the detecting circuit 120' may track the slowest transitions or oscillations among the first oscillating signal RO_OUT1, the second oscillating signal RO_OUT2, and the PLL clock signal PLL_CLK.

In this embodiment, the clock signal CLK generated by the detecting circuit 120' may be fed back to the first ring oscillator 110a and the second ring oscillator 110b.

In some embodiments of the present inventive concept, the detecting circuit 120 may perform a predetermined logic operation on the first oscillating signal RO_OUT1, the second oscillating signal RO_OUT2, and the PLL clock signal PLL_CLK to generate the clock signal CLK.

Figure 9B:
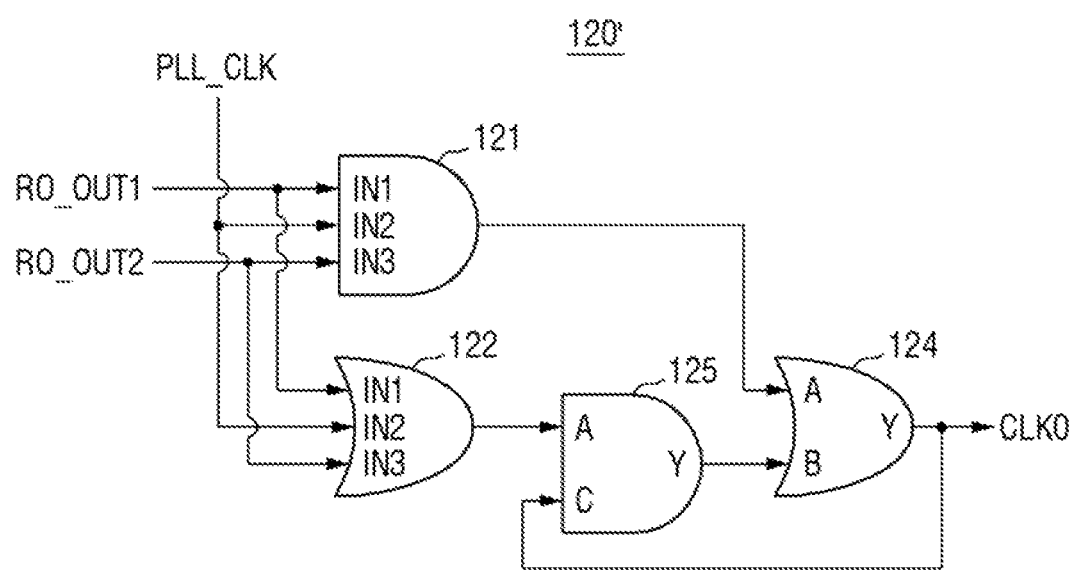
FIG. 9B shows an example configuration of a detecting circuit that may be used in the semiconductor device of FIG. 9A.

For example, as shown in FIG. 9B, the detecting circuit 120' may be a include a first logic gate 121, a second logic gate 122, a third logic gate 124, and a fourth logic gate 125. As is the case for the detecting circuit 120 described earlier, detection circuit 120' is shown to have a C-element design, used for handling asynchronous inputs, that maintains a previous output state when two inputs meet a certain criterion. In particular, detecting circuit 120' is configured to output the clock signal CLK at a frequency substantially matching the lowest oscillation frequency among the three asynchronous input signals RO_OUT1, RO_OUT2 and PLL_CLK.

Specifically, the first logic gate 121 may be a multi-input AND logic gate for performing a first logic operation, for example, an AND logic operation, on a plurality of input signals. The first logic gate 121 performs the first logic operation on the first oscillating signal RO_OUT1, the second oscillating signal RO_OUT2, and the PLL clock signal PLL_CLK and delivers the result signal to the third logic gate 124.

The second logic gate 122 may be a multi-input OR logic gate for performing a second logic operation, for example, an OR logic operation, on a plurality of input signals. The second logic gate 122 performs the second logic operation on the first oscillating signal RO_OUT1, the second oscillating signal RO_OUT2, and the PLL clock signal PLL_CLK and delivers the result signal to the fourth logic gate 125.

The third logic gate 124 may be an OR logic gate for performing a third logic operation, for example, an OR logic operation, on two input signals. The third logic gate 124 performs the third logic operation on an output signal of the first logic gate 121 and an output signal of the fourth logic gate 125 and delivers the result signal as the clock signal CLK.

The fourth logic gate 125 may be an AND logic gate for performing a fourth logic operation, for example, an AND logic operation, on two input signals. The fourth logic gate 125 performs the fourth logic operation on an output signal of the second logic gate 122 and an output signal of the third logic gate 124 and delivers the result signal to the third logic gate 124.

Figure 10:
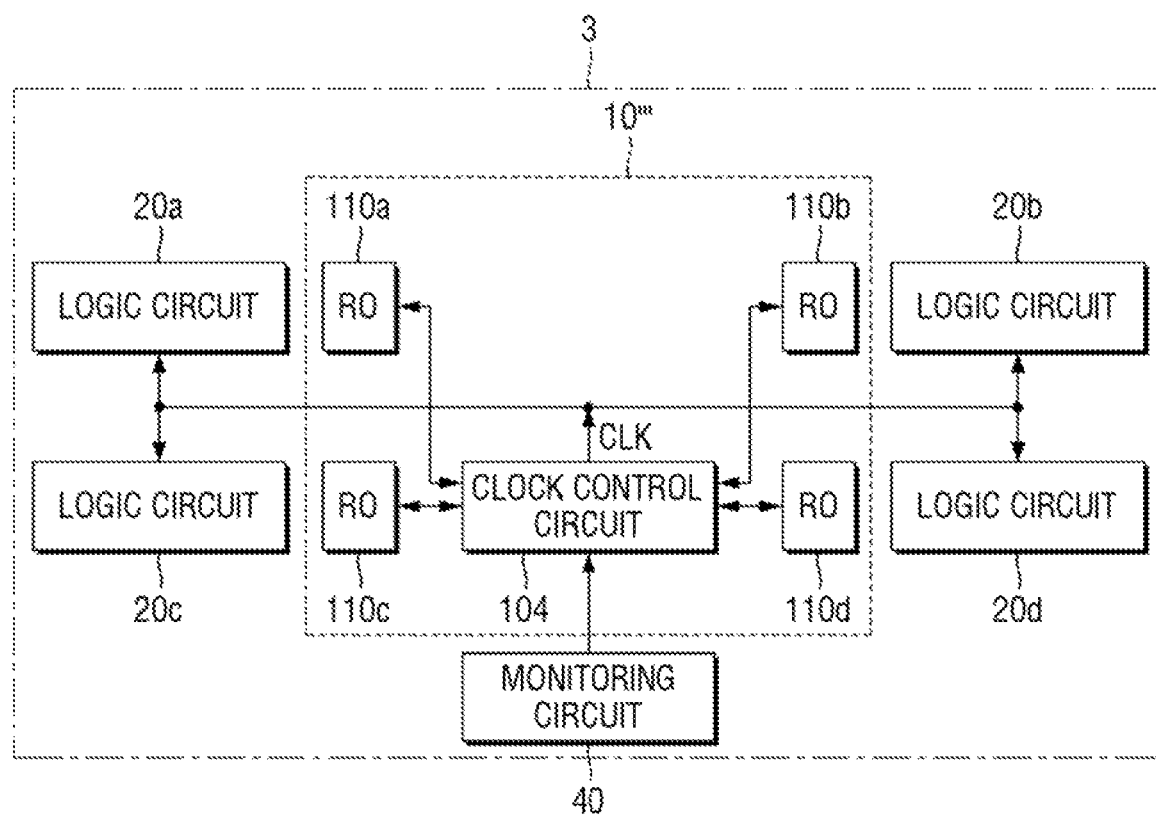
FIG. 10 is a schematic diagram illustrating a semiconductor system according to an embodiment of the present inventive concept.

FIG. 10 is a schematic diagram for illustrating a semiconductor system (operation circuit) 3 according to an embodiment of the present inventive concept. Operation circuit 3 includes logic circuits 20a to 20d, a clock generation circuit 10''', and a monitoring circuit 40.

The monitoring circuit 40 is a circuit for monitoring actual performance of the operation circuit 3 according to local variation and global variation corresponding to PVT. By monitoring the operation circuit 3 by means of the monitoring circuit 40, it is possible to track a minimum condition for operating the operation circuit 3 under various conditions and to further facilitate adjustment of a supplied voltage or a frequency of a clock signal provided to the operation circuit 3.

Figure 11:
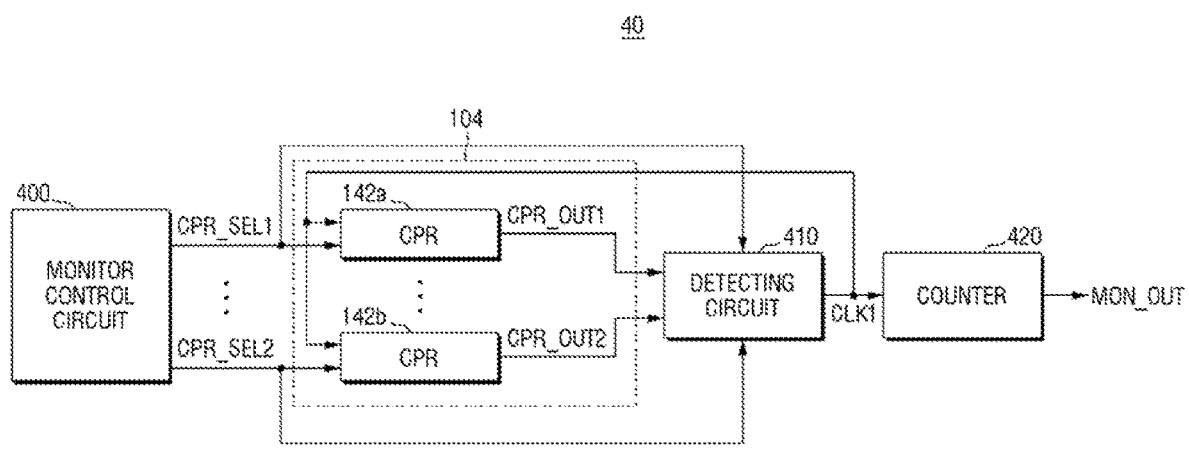
FIG. 11 is a schematic diagram illustrating a monitoring circuit according to an embodiment of the present inventive concept.

FIG. 11 is a schematic diagram illustrating an example configuration for monitoring circuit 40 according to an embodiment of the present inventive concept. Monitoring circuit 40 (which is another semiconductor device according to an embodiment of the present inventive concept), may include a monitor control circuit 400, a detecting circuit 410, and a counter 420.

The monitoring circuit 40 may use the plurality of critical path replicas 142a and 142b that have been described with reference to FIG. 6. Here, the critical path replicas 142a to 142c correspond to a replica circuit that utilizes a critical path, which corresponds to a PVT condition of the operation circuit 3, as is. For clarity of explanation, two critical path replicas 142a and 142b are provided in this embodiment, but the present inventive concept is not limited thereto.

As also shown in FIG. 6, the first critical path replica 142a may reflect a first predetermined condition, that is, a first PVT condition. For example, the first critical path replica 142a may be a replica circuit that utilizes a critical path extracted from a first corner.

The second critical path replica 142b may reflect a second predetermined condition, that is, a second PVT condition. For example, the second critical path replica 142b may be a replica circuit that utilizes a critical path extracted from a second corner and a third corner.

In some embodiments of the present inventive concept, the number of critical path replicas 142a to 142c may be optimized to a number lower than the number of critical paths extracted from all corners. For example, the plurality of critical path replicas 142a to 142c may include, among the critical paths extracted from the corners, only a result obtained from additionally filtering paths capable of satisfying a timing signoff condition.

The monitor control circuit 400 generates a first critical path replica selection signal CPR_SEL1 for selecting the first critical path replica 142a and delivers the generated first critical path replica selection signal CPR_SEL1 to the first critical path replica 142a. Also, the monitor control circuit 400 generates a second critical path replica selection signal CPR_SEL2 for selecting the second critical path replica 142b and delivers the generated second critical path replica selection signal CPR_SEL2 to the second critical path replica 142b.

Monitor control circuit 400 further delivers the first critical path replica selection signal CPR_SEL1 and the second critical path replica selection signal CPR_SEL2 to the detecting circuit 410.

The detecting circuit 410 receives the first critical path replica selection signal CPR_SEL1 and the second critical path replica selection signal CPR_SEL2 from the monitor control circuit 400 and performs a predetermined logic operation on the first oscillating signal CPR_OUT1, the second oscillating signal CPR_OUT2, the first critical path replica selection signal CPR_SEL1, and the second critical path replica selection signal CPR_SEL2 to generate a monitoring signal MON_OUT for monitoring the operation circuit 3.

In this embodiment, the output signal CLK1 generated by the detecting circuit 120 may be fed back to the first critical path replica 142a and the second critical path replica 142b.

Figure 12:
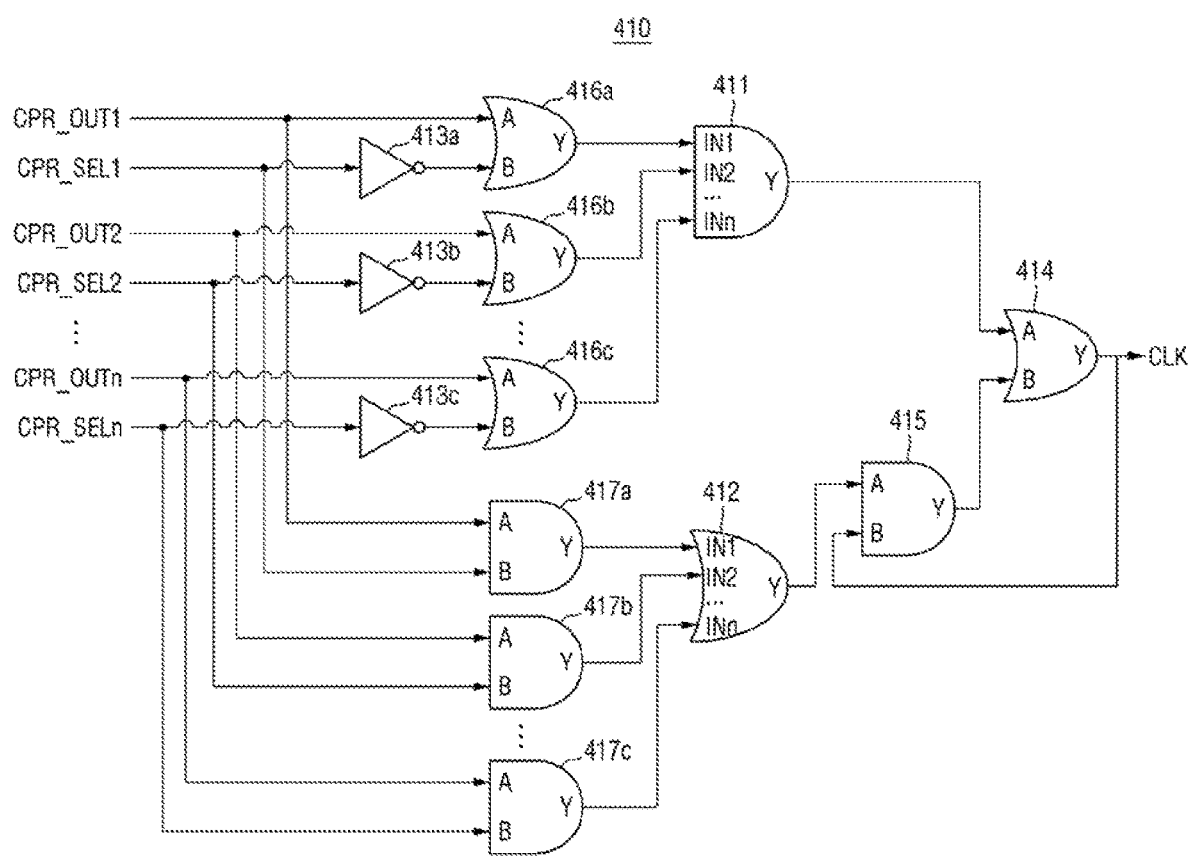
FIG. 12 is a schematic diagram illustrating a detecting circuit of a monitoring circuit according to an embodiment of the present inventive concept.

FIG. 12 is a schematic diagram illustrating an example detecting circuit 410 of the monitoring circuit 40 according to an embodiment of the present inventive concept. Detecting circuit 410 may include a first logic gate 411, a second logic gate 412, a third logic gate 414, and a fourth logic gate 415.

The first logic gate 411 may be a multi-input AND logic gate for performing a first logic operation, for example, an AND logic operation, on a plurality of first signals. The first logic gate 411 performs the first logic operation on the plurality of first signals and delivers the result signal to the third logic gate 414.

The second logic gate 412 may be a multi-input OR logic gate for performing a second logic operation, for example, an OR logic operation, on a plurality of second signals. The second logic gate 412 performs the second logic operation on the plurality of second signals and delivers the result signal to the fourth logic gate 415.

The third logic gate 414 may be an OR logic gate for performing a third logic operation, for example, an OR logic operation, on two input signals. The third logic gate 414 performs the third logic operation on an output signal of the first logic gate 411 and an output signal of the fourth logic gate 415 and delivers the result signal as the clock signal CLK.

The fourth logic gate 415 may be a multi-input AND logic gate for performing a fourth logic operation, for example, an AND logic operation, on two input signals. The fourth logic gate 415 performs the fourth logic operation on an output signal of the second logic gate 412 and an output signal of the third logic gate 414 and delivers the result signal to the third logic gate 414.

Here, the plurality of first signals include an output signal obtained by performing a fifth logic operation, for example, an OR logic operation, on the first oscillating signal CPR_OUT1 and an inverted signal of the first critical path replica selection signal CPR_SEL1 and include an output signal obtained by performing the fifth logic operation on the second oscillating signal CPR_OUT2 and an inverted signal of the second critical path replica selection signal CPR_SEL2.

The plurality of second signals include an output signal obtained by performing a sixth logic operation, for example, an AND logic operation, on the first oscillating signal CPR_OUT1 and the first critical path replica selection signal CPR_SEL1 and include an output signal obtained by performing the sixth logic operation on the second oscillating signal CPR_OUT2 and the second critical path replica selection signal CPR_SEL2.

According to the above-described various embodiments of the present inventive concept, it is possible to overcome local variation and global variation corresponding to PVT while reducing a margin necessary for a clock signal for operating a semiconductor circuit, thereby improving performance of the semiconductor circuit and reducing power consumption thereof.

While the inventive concept described herein has been particularly shown and described with reference to example embodiments thereof, it will be understood by those of ordinary skill in the art that various changes in form and details may be made therein without departing from the spirit and scope of the claimed subject matter as defined by the following claims and their equivalents.

What is claimed is:

1. A semiconductor device comprising:
a first ring oscillator disposed at a first location and configured to generate a first oscillating signal;
a second ring oscillator disposed at a second location and configured to generate a second oscillating signal, the first location being closer than the second location to a first logic circuit of an operation circuit, and the second location being closer than the first location to a second logic circuit of the operation circuit;
a detecting circuit configured to generate a first clock signal by performing a predetermined logic operation on the first oscillating signal and the second oscillating signal; and
a calibration circuit configured to generate a second clock signal for operating the operation circuit by receiving the first clock signal from the detecting circuit and performing a delay control on each of the first ring oscillator and the second ring oscillator.

2. The semiconductor device of claim 1, wherein the first clock signal generated by the detecting circuit is fed back to the first ring oscillator and the second ring oscillator to cause each of the first ring oscillator and the second ring oscillator to oscillate.

3. The semiconductor device of claim 1, wherein the calibration circuit provides, to the first ring oscillator and the second ring oscillator, a delay control signal for performing the delay control on each of the first ring oscillator and the second ring oscillator.

4. The semiconductor device of claim 3,
wherein the first ring oscillator and the second ring oscillator each comprise a first oscillation period adjusting circuit configured to adjust an oscillation period to a first unit period and a second oscillation period adjusting circuit configured to adjust the oscillation period to a second unit period smaller than the first unit period, and
wherein the delay control signal controls the first oscillation period adjusting circuit and the second oscillation period adjusting circuit.

5. The semiconductor device of claim 1, wherein the first oscillating signal and the second oscillating signal are asynchronous signals, and the detecting circuit is a C-element type circuit configured to output the first clock signal at a frequency matching a slowest oscillation frequency among the first and second oscillating signals.

6. The semiconductor device of claim 1, wherein the calibration circuit provides, to the first ring oscillator and the second ring oscillator, an enable signal for enabling only one of the first ring oscillator and the second ring oscillator to output the first or second oscillating signals to the detection circuit.

7. The semiconductor device of claim 6, wherein the calibration circuit provides a ring oscillator selection signal to the detecting circuit and receives, from the detecting circuit, the first clock signal having a clock frequency matching the first or second oscillation signal output from the ring oscillator enabled by the enable signal.

8. The semiconductor device of claim 7,
wherein the detecting circuit comprises a first logic gate, a second logic gate, a third logic gate, and a fourth logic gate,
wherein the first logic gate and the second logic gate respectively perform a first logic operation and a second logic operation on the first oscillating signal and the second oscillating signal,
wherein the third logic gate performs a third logic operation on an output signal of the first logic gate and an output signal of the fourth logic gate, and
wherein the fourth logic gate performs a fourth logic operation on an output signal of the second logic gate, an inverted signal of the ring oscillator selection signal, and an output signal of the third logic gate.

9. The semiconductor device of claim 1, further comprising a critical path replica circuit configured to receive the first clock signal from the detecting circuit and check whether a timing error has occurred in the first clock signal in a plurality of critical paths.

10. The semiconductor device of claim 9, wherein the critical path replica circuit includes a first critical path replica, which reflects a first predetermined condition, and a second critical path replica, which reflects a second predetermined condition.

11. The semiconductor device of claim 1, wherein the first clock signal reflects a first operational environment of the first logic circuit based on a frequency of the first oscillating signal and reflects a second operational environment of the second logic circuit based on a frequency of the second oscillating signal.

12. The semiconductor device of claim 1, further comprising a look up table (LUT) accessed by the calibration circuit and,
wherein the calibration circuit is configured to receive prestored data from the look up table and perform a delay control on each of the first ring oscillator and the second ring oscillator based at least in part on the prestored data.

13. A semiconductor device comprising:
a first ring oscillator disposed at a first location and configured to generate a first oscillating signal;
a second ring oscillator disposed at a second location and configured to generate a second oscillating signal, the first location being closer than the second location to a first logic circuit of an operation circuit, and the second location being closer than the first location to a second logic circuit of the operation circuit;
a phase-locked loop (PLL) disposed at a third location and configured to generate a PLL clock signal; and
a detecting circuit configured to perform a predetermined logic operation on the first oscillating signal, the second oscillating signal, and the PLL clock signal to generate a clock signal for operating the operation circuit.

14. The semiconductor device of claim 13, wherein the clock signal generated by the detecting circuit is fed back to the first ring oscillator and the second ring oscillator.

15. The semiconductor device of claim 13,
wherein the detecting circuit comprises a first logic gate, a second logic gate, a third logic gate, and a fourth logic gate,
wherein the first logic gate and the second logic gate respectively perform a first logic operation and a second logic operation on the first oscillating signal, the second oscillating signal, and the PLL clock signal,
wherein the third logic gate performs a third logic operation on an output signal of the first logic gate and an output signal of the fourth logic gate, and
wherein the fourth logic gate performs a fourth logic operation on an output signal of the second logic gate and an output signal of the third logic gate.

16. The semiconductor device of claim 13, wherein the first oscillating signal reflects a first operational environment of the first logic circuit, and the second oscillating signal reflects a second operational environment of the second logic circuit.

17. A semiconductor device comprising:
a first critical path replica configured to generate a first oscillating signal by reflecting a first condition associated with a first logic circuit in an operation circuit;
a second critical path replica configured to generate a second oscillating signal by reflecting a second condition associated with a second logic circuit in the operation circuit;
a monitor control circuit configured to generate a first critical path replica selection signal for selecting the first critical path replica, provide the generated first critical path replica selection signal to the first critical path replica, generate a second critical path replica selection signal for selecting the second critical path replica, and provide the generated second critical path replica selection signal to the second critical path replica; and
a detecting circuit configured to receive the first critical path replica selection signal and the second critical path replica selection signal from the monitor control circuit and perform a predetermined logic operation on the first oscillating signal, the second oscillating signal, the first critical path replica selection signal, and the second critical path replica selection signal to generate a monitoring signal for monitoring the operation circuit.

18. The semiconductor device of claim 17, wherein an output signal generated by the detecting circuit is fed back to the first critical path replica and the second critical path replica.

19. The semiconductor device of claim 17,
wherein the detecting circuit comprises a first logic gate, a second logic gate, a third logic gate, and a fourth logic gate,
wherein the first logic gate performs a first logic operation on a plurality of first signals,
wherein the second logic gate performs a second logic operation on a plurality of second signals,
wherein the third logic gate performs a third logic operation on an output signal of the first logic gate and an output signal of the second logic gate,
wherein the fourth logic gate performs a fourth logic operation on an output signal of the second logic gate and an output signal of the third logic gate,
wherein the plurality of first signals includes an output signal obtained by performing a fifth logic operation on the first oscillating signal and an inverted signal of the first critical path replica selection signal and includes an output signal obtained by performing the fifth logic operation on the second oscillating signal and an inverted signal of the second critical path replica selection signal, and
wherein the plurality of second signals includes an output signal obtained by performing a sixth logic operation on the first oscillating signal and the first critical path replica selection signal and includes an output signal obtained by performing the sixth logic operation on the second oscillating signal and the second critical path replica selection signal.

20. The semiconductor device of claim 17, wherein the first oscillating signal reflects a first operational environment of the first logic circuit, and the second oscillating signal reflects a second operational environment of the second logic circuit.

* * * * *